United States Patent
Huang et al.

(10) Patent No.: US 9,331,185 B2
(45) Date of Patent: May 3, 2016

(54) NON-VOLATILE MEMORY DEVICE WITH UNDERCUT ONO TRAPPING STRUCTURE AND MANUFACTURING METHOD THEREOF

(71) Applicant: UNITED MICROELECTRONICS CORP., Hsin-Chu (TW)

(72) Inventors: Ya-Huei Huang, Tainan (TW); Shen-De Wang, Hsinchu County (TW); Wen-Chung Chang, Hsinchu (TW); Feng-Ji Tsai, Hsinchu (TW); Chien-Hung Chen, Hsin-Chu (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 14/505,513

(22) Filed: Oct. 3, 2014

(65) Prior Publication Data
US 2015/0056775 A1   Feb. 26, 2015

Related U.S. Application Data

(62) Division of application No. 13/723,159, filed on Dec. 20, 2012, now abandoned.

(51) Int. Cl.
| H01L 21/336 | (2006.01) |
| H01L 29/792 | (2006.01) |
| H01L 29/66 | (2006.01) |
| H01L 21/28 | (2006.01) |
| H01L 29/423 | (2006.01) |
| H01L 29/51 | (2006.01) |

(52) U.S. Cl.
CPC .... *H01L 29/66833* (2013.01); *H01L 21/28282* (2013.01); *H01L 29/4234* (2013.01); *H01L 29/513* (2013.01); *H01L 29/518* (2013.01); *H01L 29/6659* (2013.01); *H01L 29/792* (2013.01)

(58) Field of Classification Search
CPC ............. H01L 21/28282; H01L 29/42348; H01L 29/66833; H01L 29/7923
USPC ............ 257/E21.209, E21.21, E21.423, 257/E29.309; 438/287
See application file for complete search history.

(56) References Cited

U.S. PATENT DOCUMENTS

| 6,885,072 | B1 | 4/2005 | Jeng | |
| 7,564,091 | B2* | 7/2009 | Lee | H01L 21/28282 257/314 |
| 2004/0245564 | A1* | 12/2004 | Ogura | H01L 21/28273 257/315 |
| 2011/0165770 | A1 | 7/2011 | Mori | |
| 2012/0018795 | A1* | 1/2012 | Chen | H01L 21/28282 257/324 |

* cited by examiner

*Primary Examiner* — Marcos D Pizarro
(74) *Attorney, Agent, or Firm* — Winston Hsu; Scott Margo (57) ABSTRACT

A method for manufacturing a non-volatile memory structure includes providing a substrate having a gate structure, performing a first oxidation process to form a first SiO layer at least covering a bottom corner of the conductive layer, performing a first etching process to remove the first SiO layer and a portion of the dielectric layer to form a cavity, performing a second oxidation process to form a second SiO layer covering sidewalls of the cavity and a third SiO layer covering a surface of the substrate, forming a first SiN layer filling in the cavity and covering the gate structure on the substrate, and removing a portion of the first SiN layer to form a SiN structure including a foot portion filling in the cavity and an erection portion upwardly extended from the foot portion, and the erection portion covering sidewalls of the gate structure.

8 Claims, 7 Drawing Sheets

NON-VOLATILE MEMORY DEVICE WITH UNDERCUT ONO TRAPPING STRUCTURE AND MANUFACTURING METHOD THEREOF

CROSS REFERENCE TO RELATED APPLICATIONS

This application is a division of U.S. application Ser. No. 13/723,159 filed on Dec. 20, 2012, and incorporated herein by reference in its entirety.

BACKGROUND OF THE INVENTION

1. Field of the Invention

The present invention relates to a non-volatile memory structure and a manufacturing method thereof, and more particularly, to a silicon-oxide-nitride-oxide-semiconductor (hereinafter abbreviated as SONOS) non-volatile memory structure and a manufacturing method thereof.

2. Description of the Prior Art

Semiconductor memory devices are prevalently used in computer and electronics industries as a means for retaining digital information. A typical semiconductor memory device includes a large number of memory elements, which is known as memory cells, for storing a single digital bit. Typically, the semiconductor memory devices are divided into volatile and non-volatile memory devices depending on whether the data stored in the memory devices is completely lost or not in case of power interruption.

In the conventional non-volatile memory technology, a SONOS memory structure is to build a silicon nitride layer sandwiched between two silicon oxide layers for serving as the charge trap layer while the two silicon oxide layers respectively serve as a charge tunnel layer and a charge block layer. This oxide-nitride-oxide (ONO) multilayered structure is further formed between a semiconductor substrate and a silicon control gate, and thus a SONOS memory structure is constructed. Since the ONO multilayered structure plays the essential role for storing data, it is always important to form a compact ONO structure and to improve the complicated method for manufacturing the memory structure.

SUMMARY OF THE INVENTION

According to the claimed invention, a method for manufacturing a non-volatile memory structure is provided. The method first provides a substrate having a gate structure formed thereon, and the gate structure includes a conductive layer and a dielectric layer. Then, a first oxidation process is performed to form a first silicon oxide (hereinafter abbreviated as SiO) layer at least covering a bottom corner of the conductive layer. After the first oxidation process, a first etching process is performed to remove the first SiO layer and a portion of the dielectric layer to form a cavity under the conductive layer. After the first etching process, a second oxidation process is performed to form a second SiO layer covering sidewalls of the cavity and a third SiO layer covering a surface of the substrate. After the second oxidation process, a first silicon nitride (hereinafter abbreviated as SiN) layer is formed on the substrate, and the first SiN layer fills in the cavity and covering the gate structure. Subsequently, a portion of the first SiN layer is removed to form a SiN structure. The SiN structure includes a foot portion filling in the cavity and an erection portion upwardly extended from the foot portion. Furthermore, the erection portion covers sidewalls of the gate structure.

According to the claimed invention, a non-volatile memory structure is provided. The non-volatile memory structure includes a substrate, a gate structure formed on the substrate, and a SiN structure formed on sidewalls of the gate structure. The gate structure includes a conductive layer and a dielectric layer. The SiN structure includes a foot portion formed in between the gate structure and the substrate, the foot portion inwardly extended into the gate structure and an erection portion upwardly extended from the foot portion, the erection portion covering the sidewalls of the gate structure.

According to the non-volatile memory structure and the manufacturing method thereof provided by the present invention, the foot portion of the SiN structure, which serves as the charge trap layer, is formed to fill up the cavity and sandwiched between two SiO layers. Thus, a compact ONO structure is easily obtained according to the present invention and a performance of the non-volatile memory structure is therefore always ensured.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are drawings illustrating a method for manufacturing a non-volatile memory structure provided by a first preferred embodiment of the present invention, wherein

FIGS. 8-14 are drawings illustrating a method for manufacturing a non-volatile memory structure provided by a second preferred embodiment of the present invention, wherein

DETAILED DESCRIPTION

Figure 1:
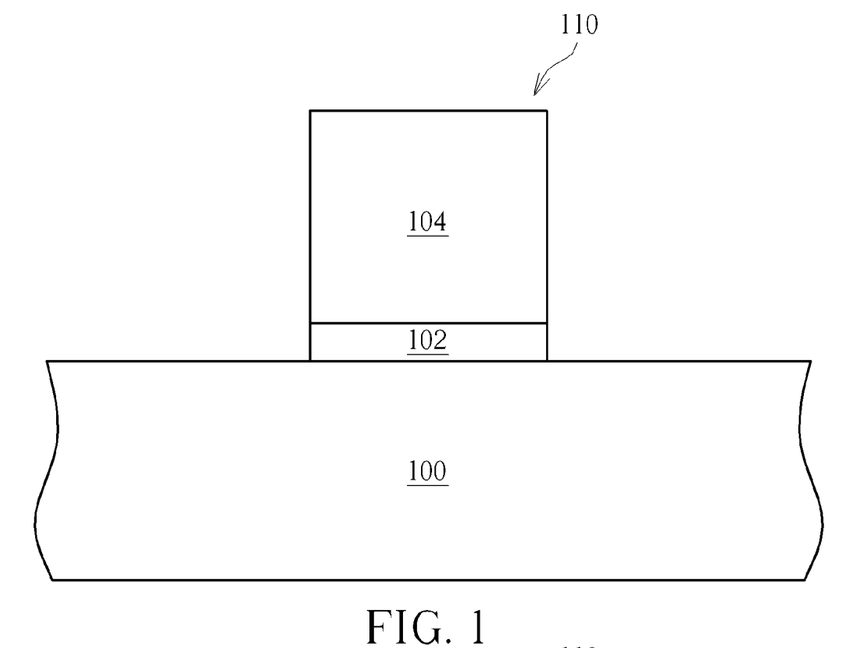

FIGS. 1-7 are drawings illustrating a method for manufacturing a non-volatile memory structure provided by a first preferred embodiment of the present invention. As shown in FIG. 1, a substrate 100 is provided. The substrate 100 includes, for example but not limited to, silicon substrate, gallium arsenide (GaAs) substrate, silicon on insulator layer (SOI) substrate, epitaxial substrate, silicon germanium substrate, or any other common semiconductor material substrate. Subsequently, a dielectric layer 102 and a conductive layer 104 are sequentially formed on the substrate 100 and followed by performing a patterning step to form a gate structure 110 on the substrate 100. The dielectric layer 102 includes SiO and the conductive layer 104 includes polysilicon in accordance with the preferred embodiment.

Figure 2:
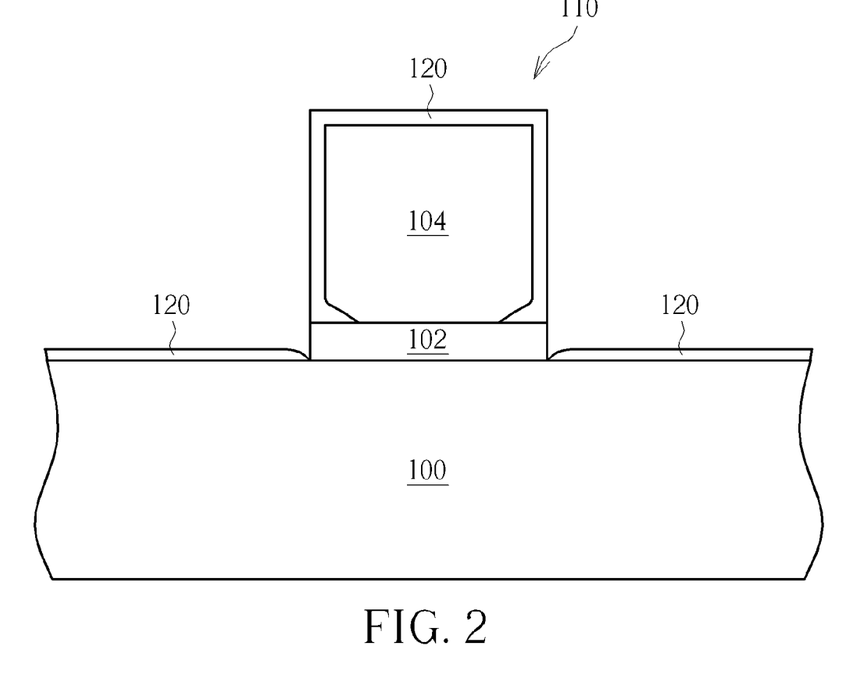
FIG. 2 is a schematic drawing in a step subsequent to FIG. 1.

Please refer to FIG. 2. Next, a first oxidation process is performed. The first oxidation process can be a rapid thermal oxidation (RTO) or be performed in a furnace, but not limited to this. Because the conductive layer 104 includes polysilicon material, it is oxidized during the first oxidation process and thus a first SiO layer 120 is grown from a surface of the conductive layer 104 and the substrate 100. Because undercut may occur during etching the conductive layer 104, it is observed that the first SiO layer 120 is formed not only covering the surface of the conductive layer 104 but also formed at a bottom corner of the conductive layer 104 and further inwardly extending into the bottom of the conductive layer 104 as shown in FIG. 2.

Figure 3:
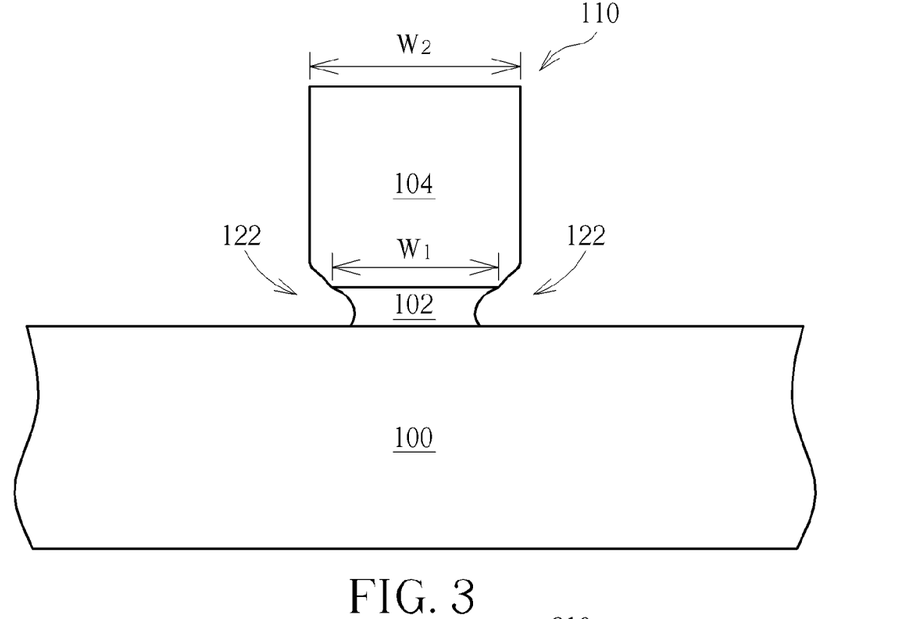
FIG. 3 is a schematic drawing in a step subsequent to FIG. 2.

Please refer to FIG. 3. After forming the first SiO layer 120 by the first oxidation process, a first etching process is performed. It is noteworthy that an etchant used in the first etching process includes etching rates substantially different between polysilicon and SiO. Therefore, the first SiO layer 120 and a portion of the dielectric layer 102 are removed and a cavity 122 is consequently formed under the conductive layer 104. As shown in FIG. 3, a portion of the bottom corner of the conductive layer 104 is exposed in each cavity 122. It should be noted that after the first etching process, a width $W_1$ of the dielectric layer 102 is smaller than a width $W_2$ of the conductive layer 104.

Figure 4:
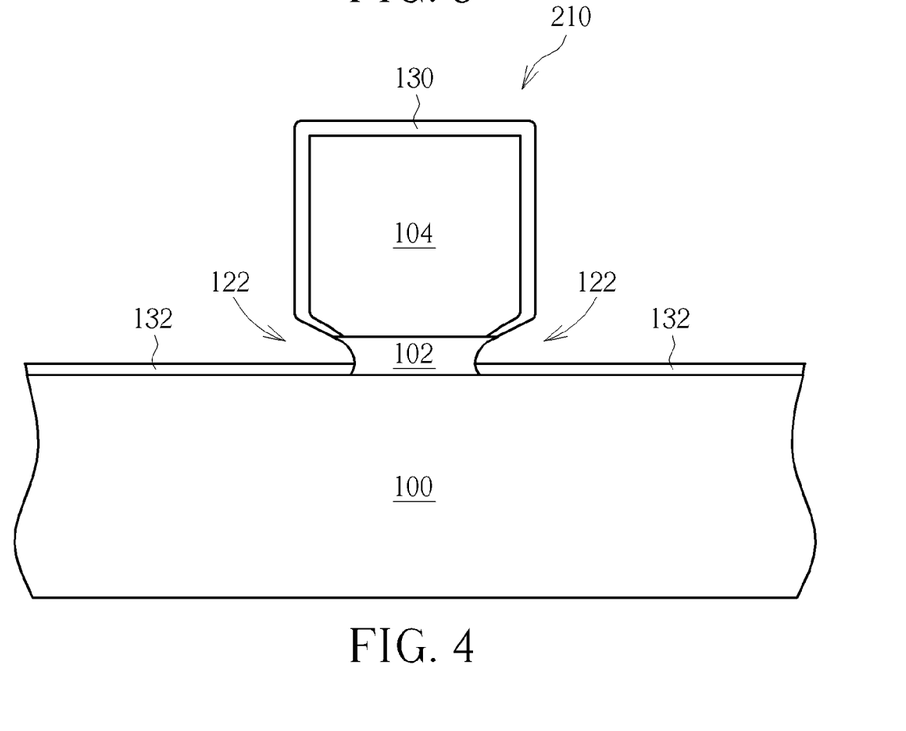
FIG. 4 is a schematic drawing in a step subsequent to FIG. 3.

Please refer to FIG. 4. After forming the cavity 122 by the first etching process, a second oxidation process is performed. The second oxidation process can include RTO or be performed in a furnace, but not limited to this. As mentioned above, since the silicon material is oxidized during the second oxidation process, a second SiO layer 130 covering surface of the conductive layer 104 and sidewalls of the cavity 122, and a third SiO layer 132 covering a surface of the substrate 100 are formed. As shown in FIG. 4, the second SiO layer 130 covering the sidewalls of the cavity 122 is also taken as covering the bottom of the conductive layer 104 exposed in the cavity 122.

Figure 5:
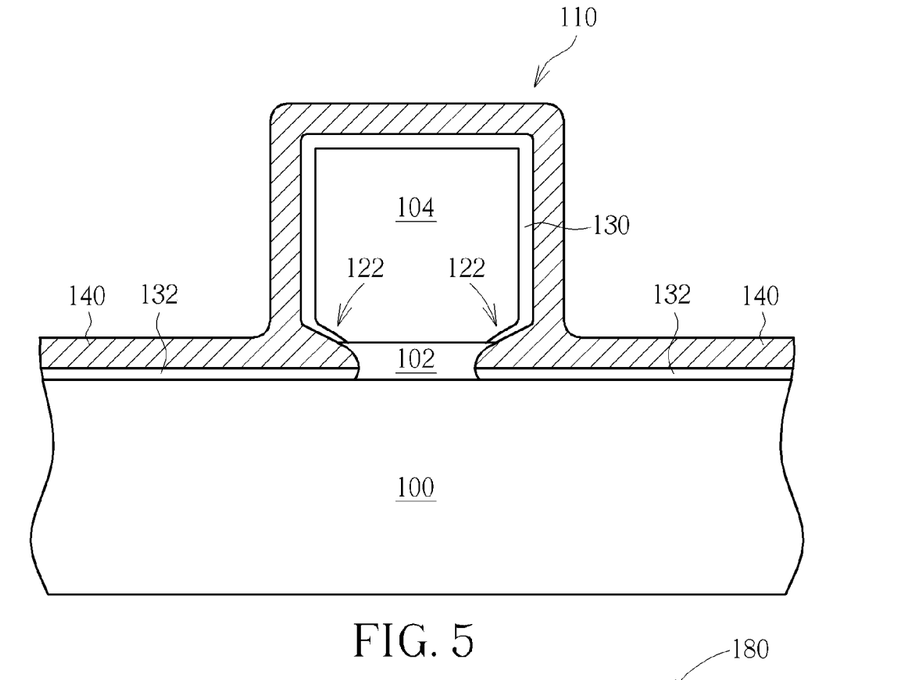
FIG. 5 is a schematic drawing in a step subsequent to FIG. 4.

Please refer to FIG. 5. After forming the second SiO layer 130 and the third SiO layer 132 by the second oxidation process, a first SiN layer 140 is formed on the substrate 100 and the gate structure 110. It is noteworthy that by forming the first SiN layer 140, the cavity 122 is filled up with the SiN material as shown in FIG. 5.

Figure 6:
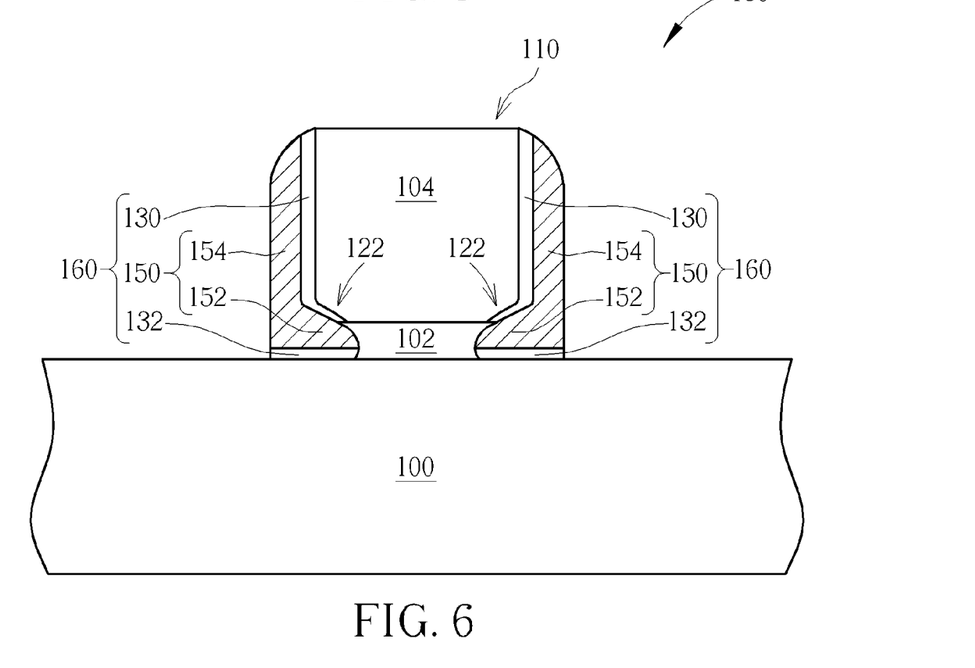
FIG. 6 is a schematic drawing in a step subsequent to FIG. 5.

Please refer to FIG. 6. Subsequently, a portion of the first SiN layer 140, a portion of the second SiO layer 130 and a portion of the third SiO layer 132 are removed from the top surface of the gate structure 110 and the surface of the substrate 100. Accordingly, a SiN structure 150 is formed on the sidewalls of the gate structure 110. It is noteworthy that the SiN structure 150 includes a foot portion 152 filling in the cavity 122 and an erection portion 154 extended from the foot portion 152. It is also noteworthy that foot portion 152 is formed between the gate structure 110 and the substrate 100 and the erection portion 154 is formed to cover sidewalls of the gate structure 110 as shown in FIG. 6. Additionally, because of the specific profile of the cavity 122, the foot portion 152 of the SiN structure 150 obtains a rough triangular shape. More important, the second SiO layer 130 covering the bottom of the conductive layer 104, the foot portion 152 of the SiN structure 150, and the third SiO layer 132 covering the substrate 100 under the gate structure 110 construct a spacer-type oxide-nitride-oxide (ONO) structure 160. In detail, the third SiO layer 132 serves as the charge channel layer, the foot portion 152 of the SiN structure 150 serves as the charge trap layer, and the second SiO layer 130 serves as the charge block layer. Since the ONO structure 160 is sandwiched between the semiconductor substrate 100 and the conductive layer 104, a SONOS non-volatile memory device 180 is obtained.

Figure 7:
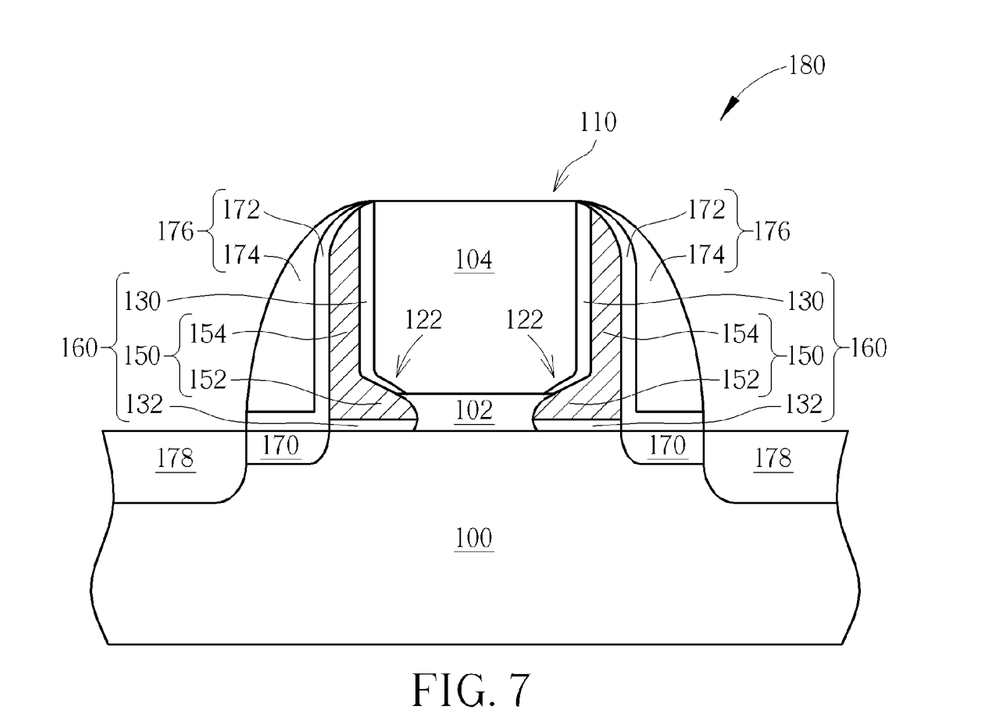
FIG. 7 is a schematic drawing in a step subsequent to FIG. 6.

Please refer to FIG. 7. After forming the ONO structure 160, a first ion implantation is performed to form lightly-doped drains (LDDs) 170 in the substrate 100 at two respective sides of the gate structure 110. Then a fourth SiO layer 172 and a second SiN layer 174 are sequentially formed on the substrate 100 and followed by performing another etching process. Consequently, a spacer 176 including the fourth SiO layer 172 and the second SiN layer 174 is obtained on the sidewalls of the gate structure 110. The spacer 176 is in contact with the SiN structure 160 and covers the erection portion 154 of the SiN structure 150. Therefore, the fourth SiO layer 172 is sandwiched between the erection portion 154 of the SiN structure 160 and the second SiN layer 174. After forming the spacer 176, a second ion implantation is performed to form a source/drain 178 in the substrate 100 at two respective sides of the gate structure 110 as shown in FIG. 7.

According to the non-volatile memory structure 180 and the manufacturing method thereof provided by the first preferred embodiment of the present invention, the cavity 122 is created for accommodating the first SiN layer 140. Therefore the ONO structure 160 formed thereafter is ensured to have sufficient SiN material for trapping charge during programming. It is also noteworthy that by creating the cavity 122, the bottom edge of the conductive layer 104 is rounded and thus a smooth profile is obtained for further improving electrical performance of the SONOS non-volatile memory structure 180.

Figure 8:
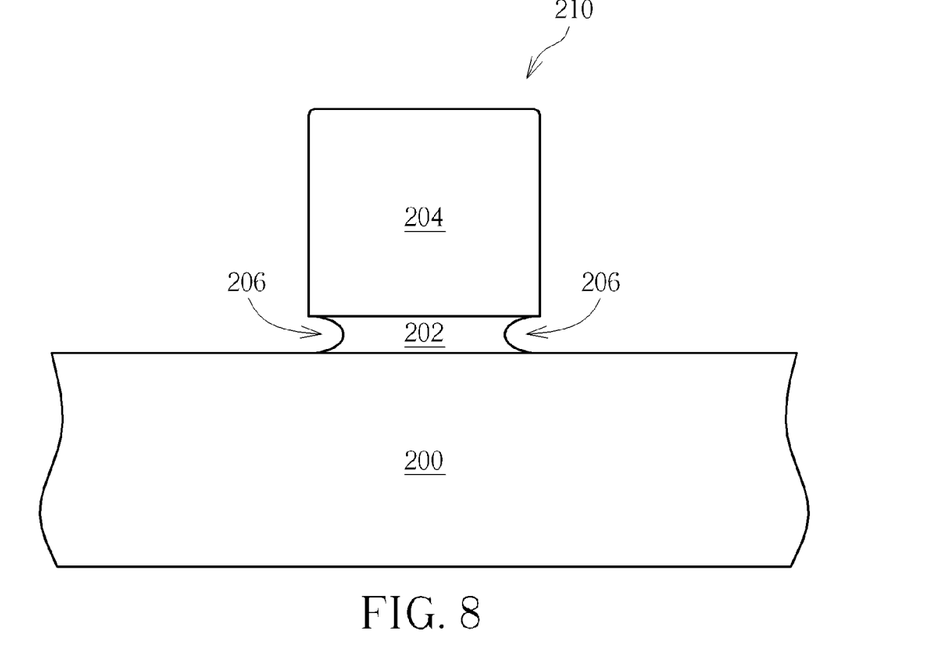

Please refer to FIGS. 8-14, which are drawings illustrating a method for manufacturing non-volatile memory structure provided by a second preferred embodiment of the present invention. It should be noted that elements the same in the first and second preferred embodiments can include the same material choice, therefore those details are omitted in the interest of brevity. As shown in FIG. 8, a substrate 200 is provided. Subsequently, a dielectric layer 202 and a conductive layer 204 are sequentially formed on the substrate 200 and followed by performing a patterning step to form a gate structure 210 on the substrate 200. After forming the gate structure 210, an etching process is performed to remove a portion of the dielectric layer 202 to form a recess 206 in the dielectric layer 202 as shown in FIG. 8.

Figure 9:
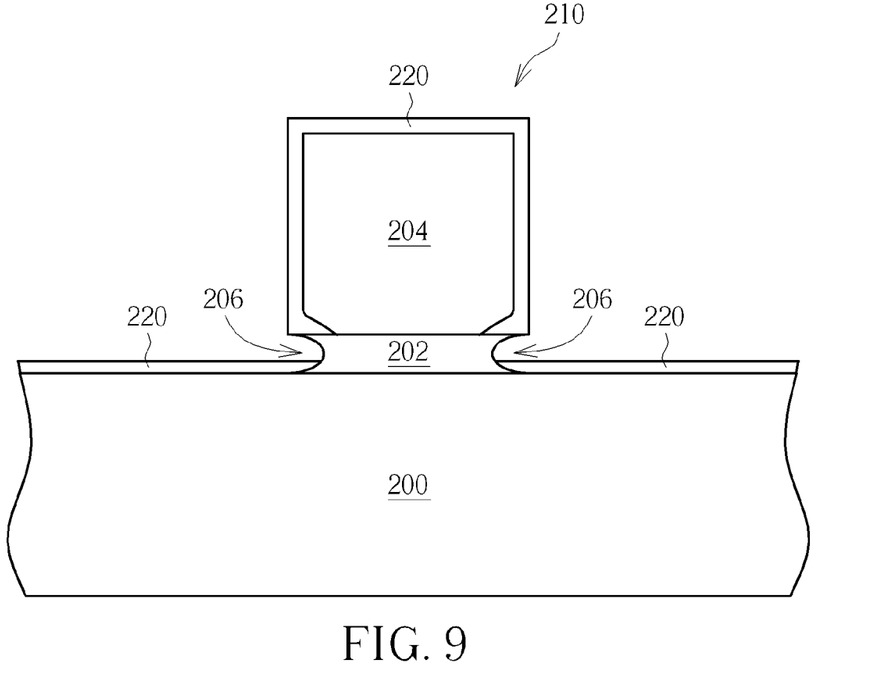
FIG. 9 is a schematic drawing in a step subsequent to FIG. 8.

Please refer to FIG. 9. Next, a first oxidation process is performed to form a first SiO layer 220 on a surface of the conductive layer 204 and the substrate 200. It is observed that the first SiO layer 220 not only covers the surface of the conductive layer 204 but also covers a bottom corner of the conductive layer 204 and inwardly extends into the bottom of the conductive layer 204 as shown in FIG. 9.

Figure 10:
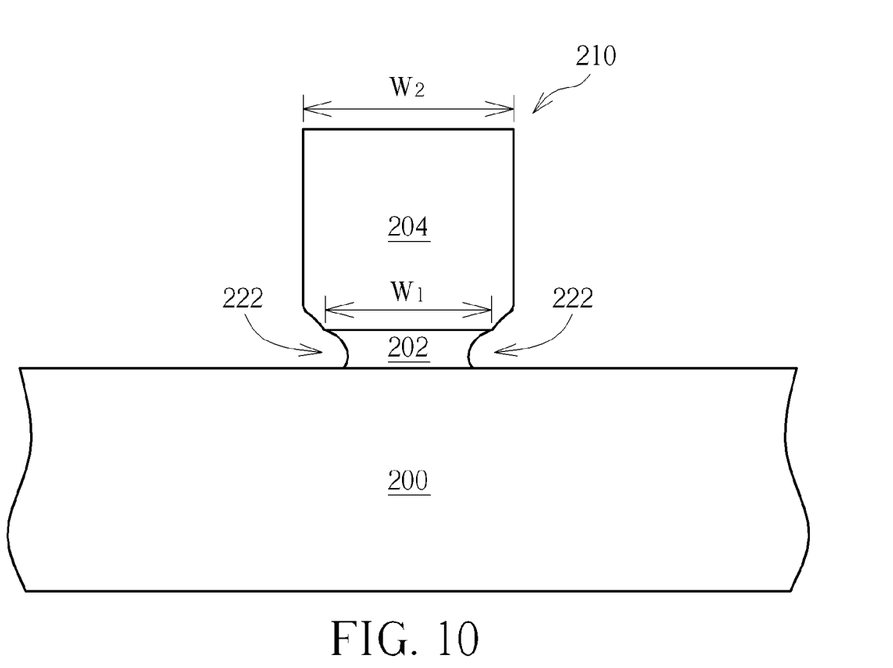
FIG. 10 is a schematic drawing in a step subsequent to FIG. 9.

Please refer to FIG. 10. After forming the first SiO layer 220 by the first oxidation process, a first etching process is performed. It is noteworthy that an etchant used in the first etching process includes etching rates substantially different between polysilicon and SiO. Therefore, the first etching process is performed to remove the first SiO layer 220 and a portion of the dielectric layer 202. Consequently, the recess 206 is deepened and a cavity 222 is formed under the conductive layer 204. It is easily conceivable that the cavity 222 shown in FIG. 10 is larger than the recess 206 shown in FIGS. 8-9. As shown in FIG. 10, a portion of the bottom corner of the conductive layer 204 is exposed in each cavity 222. It should be noted that after the first etching process, a width $W_1$ of the dielectric layer 202 is smaller than a width $W_2$ of the conductive layer 204.

Figure 11:
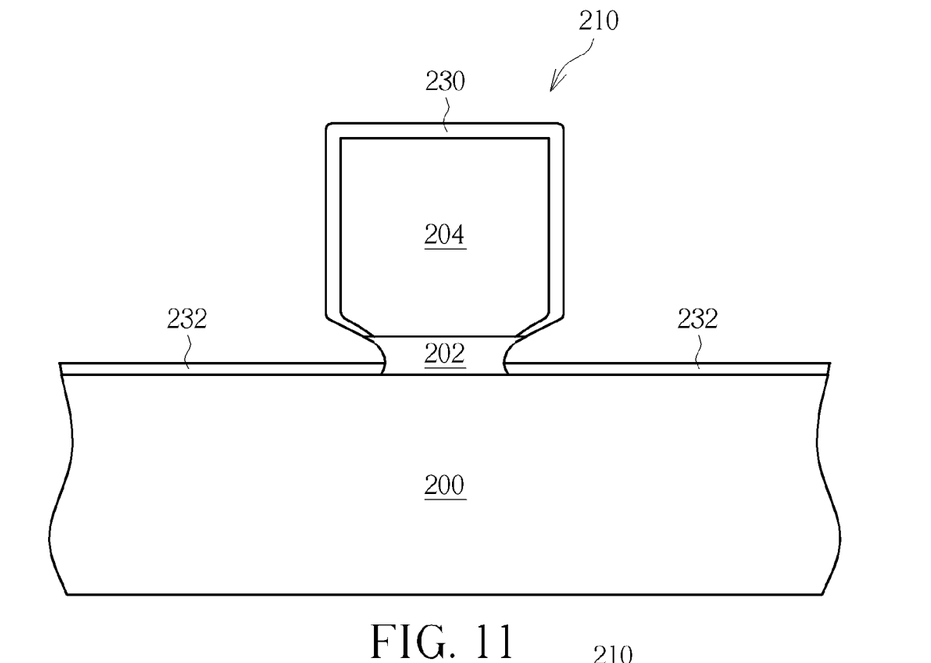
FIG. 11 is a schematic drawing in a step subsequent to FIG. 10.

Please refer to FIG. 11. After forming the cavity 222 by the first etching process, a second oxidation process is performed. The second oxidation process can include RTO or be performed in a furnace, but not limited to this. As mentioned above, since the silicon material is oxidized during the second oxidation process, a second SiO layer 230 covering surface of the conductive layer 204 and sidewalls of the cavity 222, and a third SiO layer 232 covering a surface of the substrate 202 are formed. As shown in FIG. 11, the second SiO layer 230 covering the sidewalls of the cavity 222 is also taken as covering the bottom of the conductive layer 204 exposed in the cavity 222.

Figure 12:
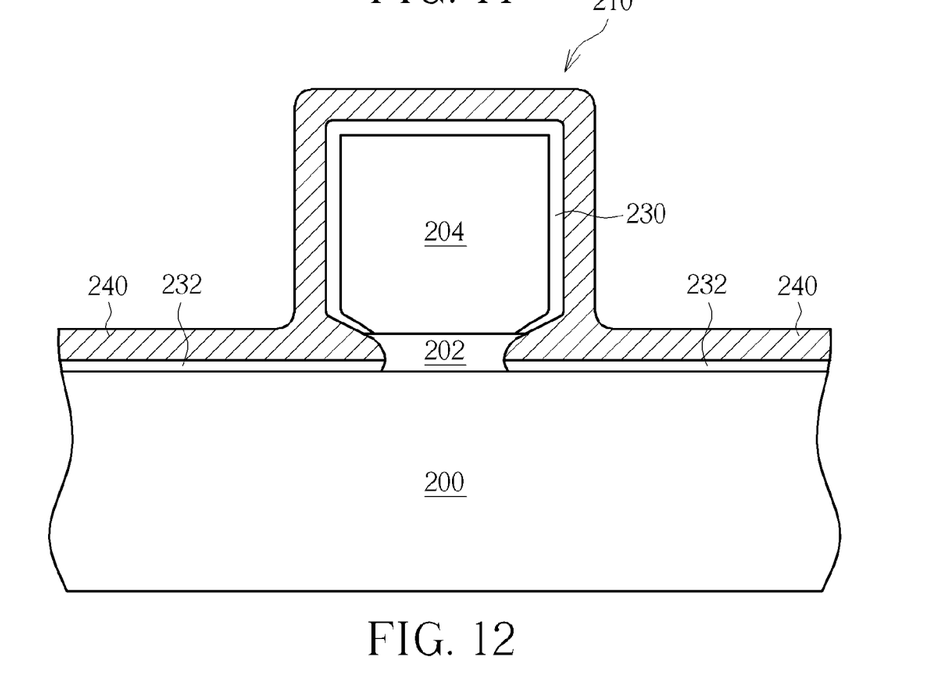
FIG. 12 is a schematic drawing in a step subsequent to FIG. 11.

Please refer to FIG. 12. After forming the second SiO layer 230 and the third SiO layer 232 by the second oxidation process, a first SiN layer 240 is formed on the substrate 200 and the gate structure 210. It is noteworthy that by forming the first SiN layer 240, the cavity 222 is filled up with the SiN material as shown in FIG. 12.

Figure 13:
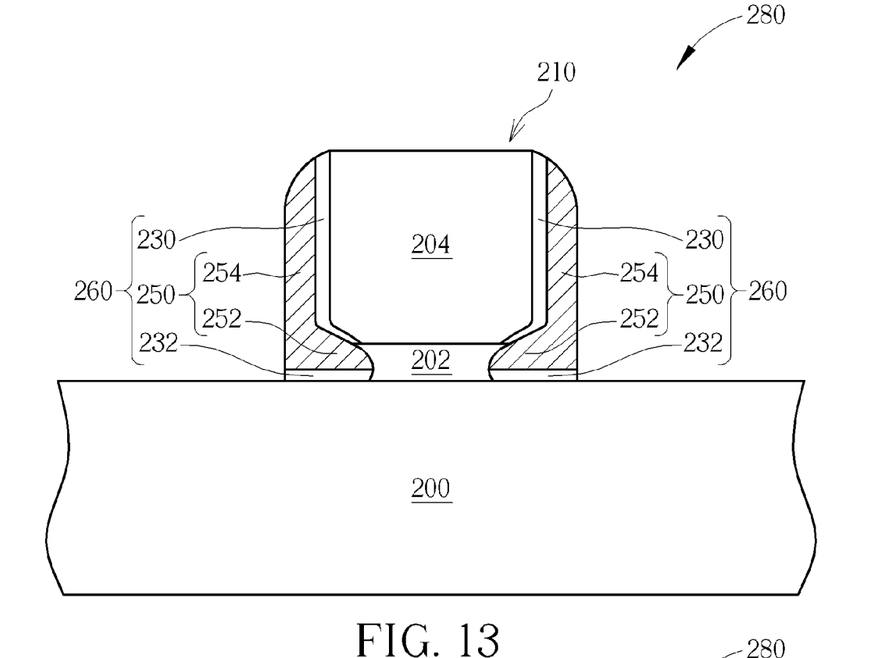
FIG. 13 is a schematic drawing in a step subsequent to FIG. 12.

Please refer to FIG. 13. Subsequently, a portion of the first SiN layer 240, a portion of the second SiO layer 230, and a portion of the third SiO layer 232 are removed from the top surface of the gate structure 210 and the surface of the substrate 200. Accordingly, a SiN structure 250 is formed on the sidewalls of the gate structure 210. It is noteworthy that the SiN structure 250 includes a foot portion 252 filling in the cavity 222 and an erection portion 254 extended from the foot portion 252. It is also noteworthy that foot portion 252 is formed between the gate structure 210 and the substrate 200 and the erection portion 254 is formed to cover the sidewalls of the gate structure 210 as shown in FIG. 13. More important, the second SiO layer 230 covering the bottom of the conductive layer 204, the foot portion 252 of the SiN structure 250, and the third SiO layer 232 covering the substrate 200 under the gate structure 210 construct a spacer-type ONO structure 260. In detail, the third SiO layer 232 serves as the charge channel layer, the foot portion 252 of the SiN structure 250 serves as the charge trap layer, and the second SiO layer 230 serves as the charge block layer. Since the ONO structure 260 is sandwiched between the semiconductor substrate 200 and the conductive layer 204, a SONOS non-volatile memory device 280 is obtained.

Figure 14:
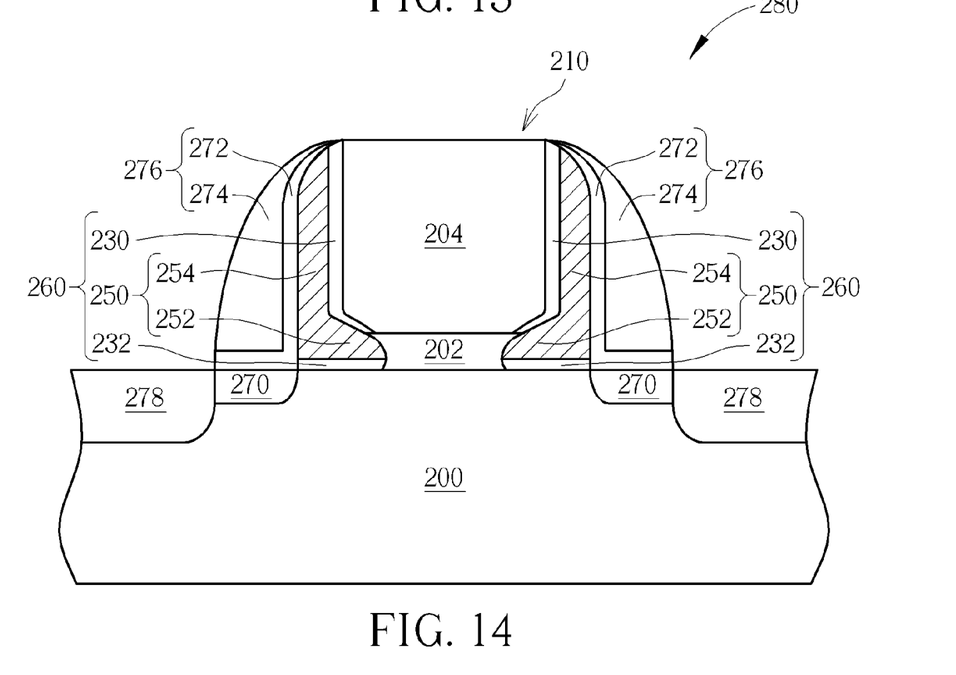
FIG. 14 is a schematic drawing in a step subsequent to FIG. 13.

Please refer to FIG. 14. After forming the ONO structure 260, a first ion implantation is performed to form LDDs 270 in the substrate 200 at two respective sides of the gate structure 210. Then a spacer 276 including a fourth SiO layer 272 and a second SiN layer 274 is formed on the sidewalls of the gate structure 210. Since the steps for forming spacer 276 are the same with the first preferred embodiment, those details are omitted herein for simplicity. The spacer 276 is in contact with the SiN structure 260 and covers the erection portion 254 of the SiN structure 250. Therefore, the fourth SiO layer 272 is sandwiched between the erection portion 254 of the SiN structure 260 and the second SiN layer 274. After forming the spacer 276, a second ion implantation is performed to a source/drain 278 in the substrate 200 at two respective sides of the gate structure 210 as shown in FIG. 14.

According to the non-volatile memory structure 280 and the manufacturing method thereof provided by the second preferred embodiment of the present invention, the cavity 222 is created for accommodating the SiN material. Furthermore, by forming the recess 206 before the first oxidation process, the final cavity 222 is formed even larger and thus more SiN material will be encompassed. Therefore the ONO structure 260 formed thereafter is ensured to have sufficient SiN material for trapping charge during programming. It is also noteworthy that by creating the cavity 222 the bottom edge of the conductive layer 204 is rounded and thus a smooth profile is obtained for further improving electrical performance of the SONOS non-volatile memory structure 280.

Accordingly, the method for manufacturing the spacer type SONOS non-volatile memory device provide by the present invention, is to form the cavity for accommodating the SiN material and to fill up the cavity with the foot portion of the SiN structure. As mentioned above, the foot portion serving as the charge trap layer is sandwiched between two SiO layers and thus a compact ONO structure is easily obtained according to the present invention and a performance of the non-volatile memory structure is therefore always ensured. Additionally, the method for manufacturing the non-volatile memory structure provided by the present invention has advantages of being easily integrated into the state-of-the-art fabrication process and superior process control.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a non-volatile memory structure, comprising:
   providing a substrate having a gate structure formed thereon, the gate structure comprising a conductive layer and a dielectric layer;
   performing a first oxidation process to form a first silicon oxide (SiO) layer at least covering a bottom corner of the conductive layer;
   performing a first etching process to remove the first SiO layer and a portion of the dielectric layer to form a cavity under the conductive layer;
   performing a second oxidation process to form a second SiO layer covering sidewalls of the cavity and a third SiO layer covering a surface of the substrate;
   forming a first silicon nitride (SiN) layer on the substrate, the first SiN layer filling in the cavity and covering the gate structure; and
   removing a portion of the first SiN layer to form a SiN structure comprising a foot portion filling in the cavity and an erection portion upwardly extended from the foot portion, and the erection portion covering sidewalls of the gate structure.

2. The method for manufacturing the non-volatile memory structure according to claim 1, further comprising forming lightly-doped drains (LDDs) in the substrate after forming the SiN structure.

3. The method for manufacturing the non-volatile memory structure according to claim 1, further comprising forming a source/drain in the substrate at two sides of the gate structure.

4. The method for manufacturing the non-volatile memory structure according to claim 1, wherein the second SiO layer, the foot portion of the SiN structure, and the third SiO layer construct an oxide-nitride-oxide (ONO) structure.

5. The method for manufacturing the non-volatile memory structure according to claim 1, further comprising performing a second etching process to remove a portion of the dielectric layer to form a recess in the dielectric layer before the first oxidation process.

6. The method for manufacturing the non-volatile memory structure according to claim 5, wherein the cavity is larger than the recess.

7. The method for manufacturing the non-volatile memory structure according to claim 1, further comprising forming a spacer on the sidewalls of the gate structure, and the spacer is in contact with the SiN structure.

8. The method for manufacturing the non-volatile memory structure according to claim 7, wherein the spacer further comprises a fourth SiO layer and a second SiN layer, and the fourth SiO layer is sandwiched between the SiN structure and the second SiN layer.

* * * * *